United States Patent
Takeuchi et al.

(10) Patent No.: US 8,031,013 B2
(45) Date of Patent: Oct. 4, 2011

(54) SURFACE-MOUNT TYPE CRYSTAL OSCILLATOR

(75) Inventors: Toshiaki Takeuchi, Saitama (JP);
Kenichi Sugawara, Saitama (JP);
Kouichi Moriya, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 102 days.

(21) Appl. No.: 12/370,774

(22) Filed: Feb. 13, 2009

(65) Prior Publication Data
US 2009/0206938 A1 Aug. 20, 2009

(30) Foreign Application Priority Data
Feb. 15, 2008 (JP) .................. 2008-034853

(51) Int. Cl.
*H03B 1/00* (2006.01)
*H03B 5/32* (2006.01)
(52) U.S. Cl. ........ 331/68; 331/108 C; 331/158; 310/348
(58) Field of Classification Search ............ 331/68, 331/69, 108 C, 108 D, 116 FE, 116 R, 154, 331/158, 176; 310/311, 315, 344, 346, 348, 310/349, 351, 365, 366
See application file for complete search history.

(56) References Cited

U.S. PATENT DOCUMENTS

| | | | | |
|---|---|---|---|---|
| 4,750,246 A | * | 6/1988 | Pollard | 29/25.35 |
| 4,873,495 A | * | 10/1989 | Doyen et al. | 331/68 |
| 5,446,954 A | * | 9/1995 | Knecht et al. | 29/25.35 |
| 5,952,894 A | * | 9/1999 | Fukiharu | 331/176 |
| 6,531,807 B2 | * | 3/2003 | Tanaka et al. | 310/344 |
| 7,123,108 B2 | * | 10/2006 | Isimaru | 331/68 |
| 7,489,208 B2 | * | 2/2009 | Moriya | 331/158 |

FOREIGN PATENT DOCUMENTS

| | | |
|---|---|---|
| JP | 9-83248 | 3/1997 |
| JP | 2002-330027 | 11/2002 |
| JP | 2002-335128 | 11/2002 |
| JP | 2003-32042 | 1/2003 |
| JP | 2003-51719 | 2/2003 |
| JP | 2004-7469 | 1/2004 |
| JP | 2005-65140 | 3/2005 |

OTHER PUBLICATIONS

Japanese Rejection Notice dated Apr. 22, 2010, from the corresponding Japanese Application.

* cited by examiner

*Primary Examiner* — Levi Gannon
(74) *Attorney, Agent, or Firm* — Katten Muchin Rosenman LLP

(57) ABSTRACT

A surface-mount type crystal oscillator includes: a container body with a first recess and a second recess; a crystal blank including excitation electrodes on respective principal surfaces thereof and hermetically encapsulated in the first recess; and an IC chip which is accommodated in the second recess and into which at least an oscillation circuit using the crystal blank is integrated. The container body includes a bottom wall and a frame wall provided on the bottom wall. Two openings which make up the first and second recesses, respectively, are formed in juxtaposition in the frame wall. A pair of inspection terminals are provided in an area of a top surface of the frame wall which surrounds the second recess. The inspection terminals are electrically connected to the excitation electrodes of the crystal blank.

5 Claims, 7 Drawing Sheets

SURFACE-MOUNT TYPE CRYSTAL OSCILLATOR

BACKGROUND OF THE INVENTION

1. Field of the Invention

The present invention relates to a surface mount type quartz crystal oscillator with a reduced height dimension, and in particular, to a surface mount type crystal oscillator mounted in a thin electronic card or a smart card such as a SIM (Subscriber Identify Module) card, a PC (Personal Computer) card, or an IC (Integration Circuit) card.

2. Description of the Related Arts

An SIM card, used in a cellular phone, is a typical example of an electronic card composed of a small card containing a memory device and an IC chip. The SIM card stores authentication information and the like for the cellular phone and is used to store use permission information for the cellular phone and personal information such as a telephone number. In recent years, efforts have been made to incorporate a GPS (Global Positioning System) function into the SIM card. In this case, a precise frequency reference signal needs to be supplied to a GPS receiver circuit. Thus, the card needs to include a temperature compensated crystal oscillator of a surface-mount type with a height, i.e., a thickness; reduced so as to accommodate the SIM card. The SIM card is, for example, 0.76 mm in thickness. Thus, the surface-mount type crystal oscillator contained in the SIM card needs to have a thickness of 0.5 to 0.4 mm or less.

The surface-mount type crystal oscillator is composed of a quartz crystal blank and an IC chip with an oscillation circuit that uses the crystal blank; the crystal blank and the IC chip are accommodated in a surface-mount type container. The surface-mount type crystal oscillator is built in various portable devices as a reference source for frequency or time. The surface-mount type temperature compensated crystal oscillator is one kind of surface-mount type crystal oscillators which includes a temperature compensating mechanism built in the IC chip to compensate for frequency-temperature characteristics of the crystal blank.

In general, surface-mount type crystal oscillators are classified into, for example, a one-chamber type, a two-chamber type (i.e., H-shaped cross section type), and a bonding type. In a one-chamber type crystal oscillator, the crystal blank and the IC chip are hermetically encapsulated in a single recess formed in a container body. FIG. 1A is a sectional view of an example of a configuration of a conventional surface-mount type temperature compensated crystal oscillator of the one-chamber type. FIG. 1B is a plan view of an IC chip used in the crystal oscillator.

In the illustrated one-chamber type crystal oscillator, a recess is formed in one principal surface of flat, generally parallelepipedic container body 1 which is made up of laminated ceramics. A step portion is formed on an inner wall of the recess. Pair of holding terminals 10 is provided on a top surface of the step portion of the recess to hold crystal blank 3. IC chip 2 and crystal blank 3 are accommodated in the recess. In the crystal oscillator, metal ring 13 is provided on an opening end surface of container body 1, that is, a top surface which surrounds the recess. Metal cover 14 is seam-welded to metal ring 13 to close and seal crystal blank 3 and IC chip 2.

IC chip 2 has a generally rectangular planar shape, and includes at least an oscillation circuit and a temperature compensating mechanism integrated therein. The oscillation circuit uses crystal blank 3 and the temperature compensating mechanism compensates for frequency-temperature characteristics of crystal blank 3. In IC chip 2, electronic circuits are formed on one principal surface of a semiconductor substrate by a normal semiconductor device fabrication process. One of both principal surfaces of the semiconductor substrate on which the electronic circuits are formed is called a circuit forming surface. A plurality of, in this case, three IC terminals 4, used to connect IC chip 2 to an external circuit, are provided on the circuit forming surface of IC chip 2 along each long side thereof. IC terminals 4 are formed as, for example, conductive pads. IC terminals 4 include a power supply terminal (Vcc), an output terminal (OUT), a ground terminal (GND), and an AFC terminal, as well as a pair of crystal IC terminals 4x, 4y used for electric connection to crystal blank 3. Among IC terminals 4, the power supply, output, ground, and AFC terminals are arranged at positions corresponding to four corners of the circuit forming surface. Each of crystal IC terminals 4x, 4y provided at positions corresponding to a central region of a corresponding one of two long sides of the circuit forming surface.

Plurality of circuit terminals 6 are provided on an inner bottom surface of a recess of container body 1 in association with IC terminals 4. IC chip 2 is secured to the inner bottom surface of the recess by performing ultrasonic thermocompression bonding using bumps 5 as flip chip bonding, to join IC terminals 4 to circuit terminals 6.

Mounting terminals 7, used to surface-mount the crystal oscillator on a wiring board, are provided in four corners of an outer bottom surface of the container body 1. Among IC terminals 4, the power supply, output, ground, and AFC terminals are electrically connected to mounting terminals 7 via a lamination plane between ceramic layers of container body 1 by means of a conductive path (not shown) formed in container body 1. Crystal IC terminals 4x, 4y are electrically connected to pair of holding terminals 10 by the conductive path (not shown) formed on container body 1.

As shown in FIG. 2B, crystal blank 3 is, for example, a generally rectangle AT-cut quartz crystal blank including excitation electrodes 8a, 8b formed on respective principal surfaces. Extraction electrodes 9a, 9b extend from excitation electrodes 8a, 8b toward opposite sides of one end of crystal blank 3. Each of extraction electrodes 9a, 9b is folded back between the opposite principal surfaces of crystal blank 3 at the position of the end of crystal blank 3. Crystal blank 3 is held in the recess of container body 1 and electrically connected to IC chip 2 by securing extraction electrodes 9a, 9b to holding terminals 10 by conductive adhesive 11 at positions where extraction electrodes 9a, 9b are extracted. In an operation of securing crystal blank 3, conductive adhesive 11 is applied only onto holding terminals 10. Thus, no conductive adhesive is present on a top surface, in FIG. 2B, of crystal blank 3.

A pair of inspection terminals 12 are provided on an outer side surface of container body 1. Holding terminals 10 are also electrically connected to inspection terminals 12. Inspection terminals 12 are used to measure vibration characteristics of crystal blank 3 per se. The vibration characteristics include, for example, crystal impedance (CI). Inspection terminals 12 are formed on an end surface of each ceramic layer constituting container body 1. However, in container body 1 composed of a plurality of laminated ceramic layers, no inspection terminals 12 are formed on the end surfaces of the uppermost and lowermost layers in order to prevent electric short-circuiting to metal rings 13 or the wiring board. Thus, the length of inspection terminal 12 is smaller than the height of container body 1 in a height direction of the crystal oscillator.

In the above description, circuit terminals 6, mounting terminals 7, holding terminals 10 and inspection terminals 12 are each provided as an electrode layer formed on a surface of the corresponding laminated ceramic layer.

In the two-chamber type crystal oscillator, the crystal blank is hermetically encapsulated in a recess formed in one of the principal surfaces of the container body. The IC chip is accommodated in a recess formed in the other principal surface. In this case, the container body has an H-shaped cross section. The mounting terminals are provided in the four corners of a surface of the container body which surrounds the recess with the IC chip accommodated therein. The inspection terminals are provided on the outer side surface of the container body, and alternatively the bottom surface of the recess with the IC chip accommodated therein.

The bonding type crystal oscillator is constructed by joining a mounting substrate in which the IC chip is accommodated and which includes the mounting terminals, to a crystal unit composed of the crystal blank hermetically encapsulated in a container. IC chip 2 is connected to the crystal blank and the mounting terminals as described above. In this case, terminals used to join the crystal unit to the mounting substrate may also be used as inspection terminals. Japanese Patent Laid-Open Application No. 2002-330027 (JP-2002-330027A) discloses an example of the bonding type crystal oscillator in which an assembly constructed by connecting the IC chip to a lead frame is joined to the crystal unit.

For any of the one-chamber, two-chamber, and bonding type crystal oscillators of surface-mount type, when the crystal oscillator is configured into a temperature compensated crystal oscillator, mounting terminals 7 such as the power supply terminal and the AFC terminal are used as write terminals to write temperature compensation data to the temperature compensating mechanism in the IC chip. By writing the temperature compensation data corresponding to the frequency-temperature characteristics of the crystal blank to the temperature compensating mechanism, a variation in frequency caused by the crystal blank in association with a variation in temperature can be compensated for. The write terminals may be provided on the outer surface of the container body separately from the mounting terminals.

However, in any type of surface-mount type crystal oscillator configured as described above, the IC chip and crystal blank 3 are arranged along the height direction of the crystal oscillator. Thus, a lower limit on the height dimension of the crystal oscillator is about 0.8 mm. The above-described surface-mount type crystal oscillators are unsuitable for the SIM card, which needs to be about 0.5 mm or less in height.

Japanese Patent Laid-Open Application No. 9-83248 (JP-9-083248A) discloses that the height dimension of the crystal oscillator can be reduced by arranging IC chip 2 and crystal blank 3 on the bottom surface of the recess of the container body and in juxtaposition in a horizontal direction. FIGS. 2A and 2B are a sectional view and a plan view of the crystal oscillator in which IC chip 2 and crystal blank 3 are arranged, in a horizontal direction, on the inner bottom surface of the recess formed in container body 1. No step portion is formed on an inner side surface of the recess of container body 1. A pair of holding terminals 10 are provided directly on the inner bottom surface of the recess.

The IC chip and crystal blank 3 are thus arranged on the inner bottom surface of the recess of the container body and in juxtaposition in the horizontal direction. Then, the height dimension of the crystal oscillator can be reduced down to about 0.5 mm in view of the thickness of the IC chip including the bumps, the distance between the IC chip and the metal cover, and the thickness of the metal cover per se. Instead of the flip chip bonding technique using the bumps, wire bonding may be used to electrically connect the IC chip to the container body. Also in this case, the height dimension of the crystal oscillator can be reduced to about 0.5 mm. However, either with the wire bonding or using the bumps, the conventional technique has difficulty in reducing the height of the crystal oscillator to less than 0.5 mm.

Furthermore, the above-described reduced height dimension of the crystal oscillator reduces the height of the container body per se and the size of inspection terminals 12 formed on the outer side surface of the container body, particularly the length of inspection terminals 12 along the height direction of the container body. The reduced size of inspection terminals 12 hinders a probe from a measuring instrument from abutting against inspection terminals 12.

Japanese Patent Laid-Open Application Nos. 2003-32042 and 2003-51719 (JP-2003-032042A and JP-2003-051719A) disclose real-time clock modules including a U-shaped crystal blank and an IC chip driving the crystal blank, the clock module using a container made up of laminated ceramics and including two recesses formed in one principal surface. The crystal blank is accommodated in one of the recesses, the IC chip is accommodated in the other recess, and the container and the IC chip are electrically connected together by wire bonding. According to JP-2003-32042A, both recesses are covered. According to JP-2003-51719A, the recess with the crystal blank accommodated therein is covered, whereas the recess with the IC chip accommodated therein is sealed with mold resin. Thus, neither of the real-time dock modules includes a pair of inspection terminals used to measure the vibration characteristics of the crystal blank per se.

SUMMARY OF THE INVENTION

An object of the present invention is to provide a surface-mount type crystal oscillator in which an IC chip and a crystal blank are arranged on an inner bottom surface of a recess of a container body and in a horizontal direction, thus reducing the height dimension of the crystal oscillator and facilitating abutment of a probe against inspection terminals.

The object of the present invention is accomplished by a surface-mount type crystal oscillator including: a container body with a first recess and a second recess; a crystal blank including excitation electrodes on respective principal surfaces thereof and hermetically encapsulated in the first recess; and an IC chip which is accommodated in the second recess and into which at least an oscillation circuit using the crystal blank is integrated, wherein the container body includes a bottom wall and a frame wall provided on the bottom wall, openings which make up the first and second recesses, respectively, are formed in juxtaposition in the frame wall, and an inspection terminal is provided in an area of a top surface of the frame wall which surrounds the second recess, the inspection terminal being electrically connected to the excitation electrode of the crystal blank.

In this configuration, the crystal blank and the IC chip are accommodated in the separate recesses. This eliminates the need to encapsulate the IC chip per se with a metal cover. A height from a top surface of the bottom wall to a surface of the IC chip which is different from a circuit forming surface depends basically on the thickness of the IC chip. If the IC chip is secured to the container body using ultrasonic thermocompression bonding, the height is equal to the sum of the thickness of the IC chip and the diameter of a bump. For the thickness of the crystal oscillator at a position where the second recess is formed, the thickness of the metal cover, the distance between the metal cover and the IC chip, and the like need not be taken into account. As a result, the maximum thickness of the crystal oscillator depends on the thickness thereof at the first recess. The crystal blank is hermetically encapsulated in the first recess using the metal cover. The thickness of the crystal blank depends on the vibration frequency thereof but is generally smaller than that of the IC chip. Therefore, the present invention enables a reduction in the height dimension of the surface-mount type crystal oscillator compared to the conventional one.

Furthermore, the inspection terminal is provided on the top surface of the frame wall in the area around the second recess. The present invention thus allows vibration characteristics of the crystal blank, serving as the crystal unit, to be easily measured.

DETAILED DESCRIPTION OF THE PREFERRED EMBODIMENTS

Figure 1A:
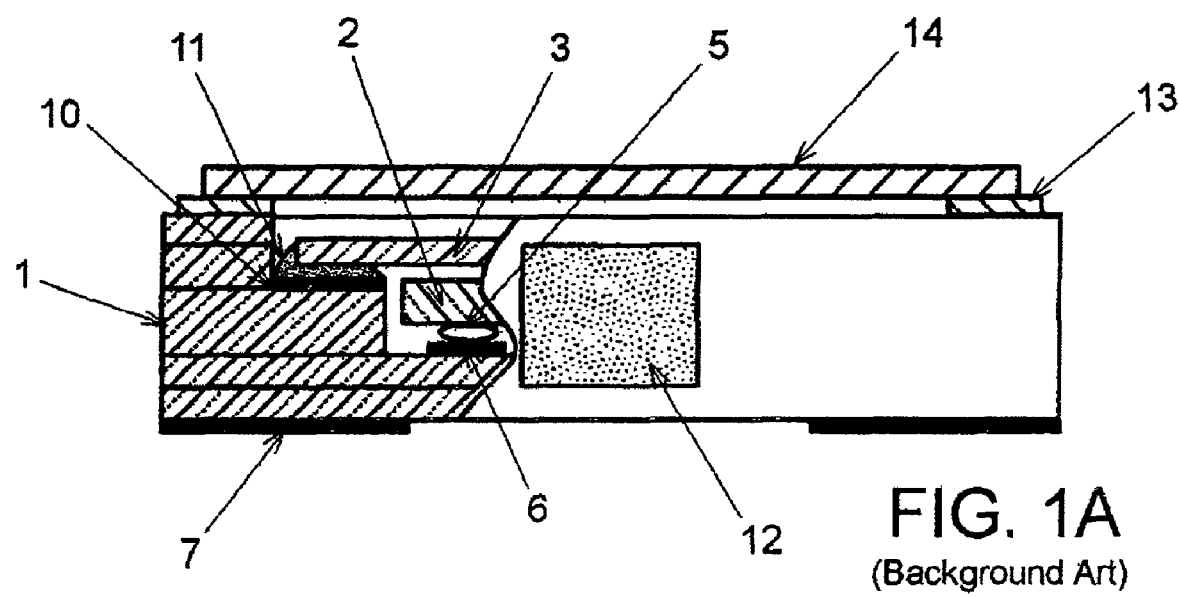
FIG. 1A is a sectional view showing an example of a configuration of a conventional surface-mount type temperature compensated crystal oscillator.
Figure 1B:
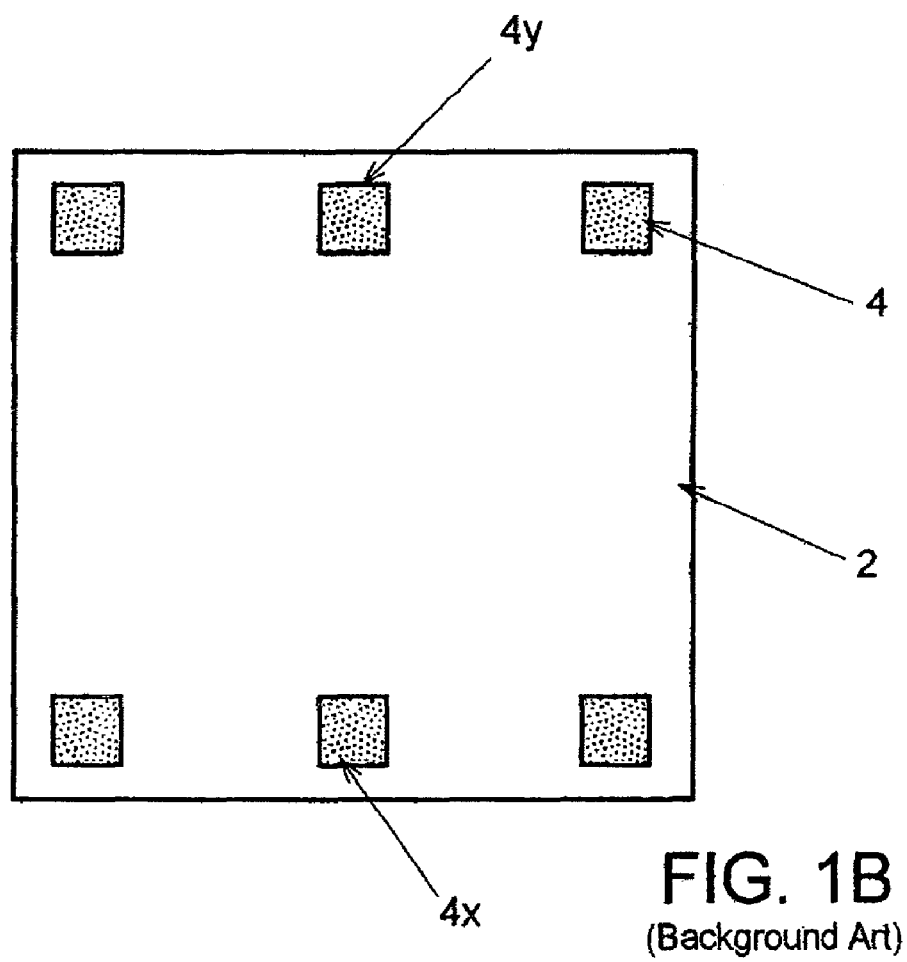
FIG. 1B is a plan view of an IC chip.
Figure 2A:
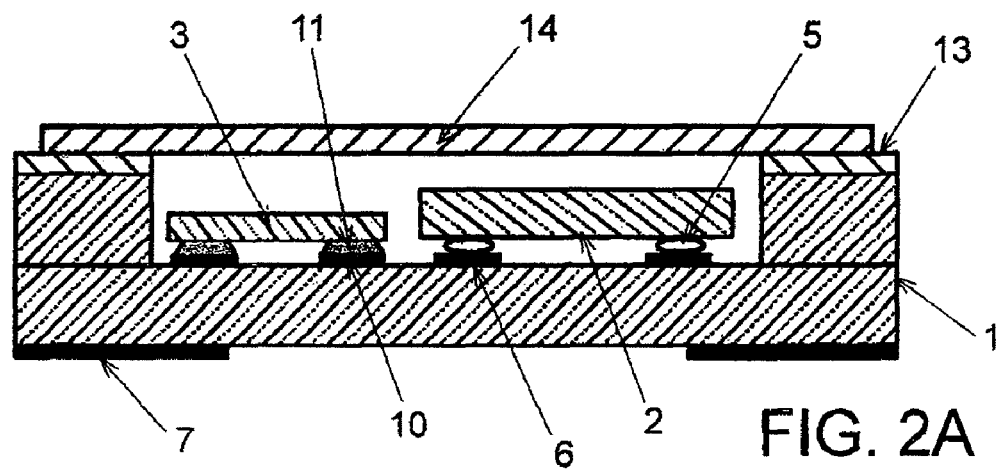
FIG. 2A is a sectional view showing another example of a configuration of a conventional surface-mount type temperature compensated crystal oscillator.
Figure 2B:
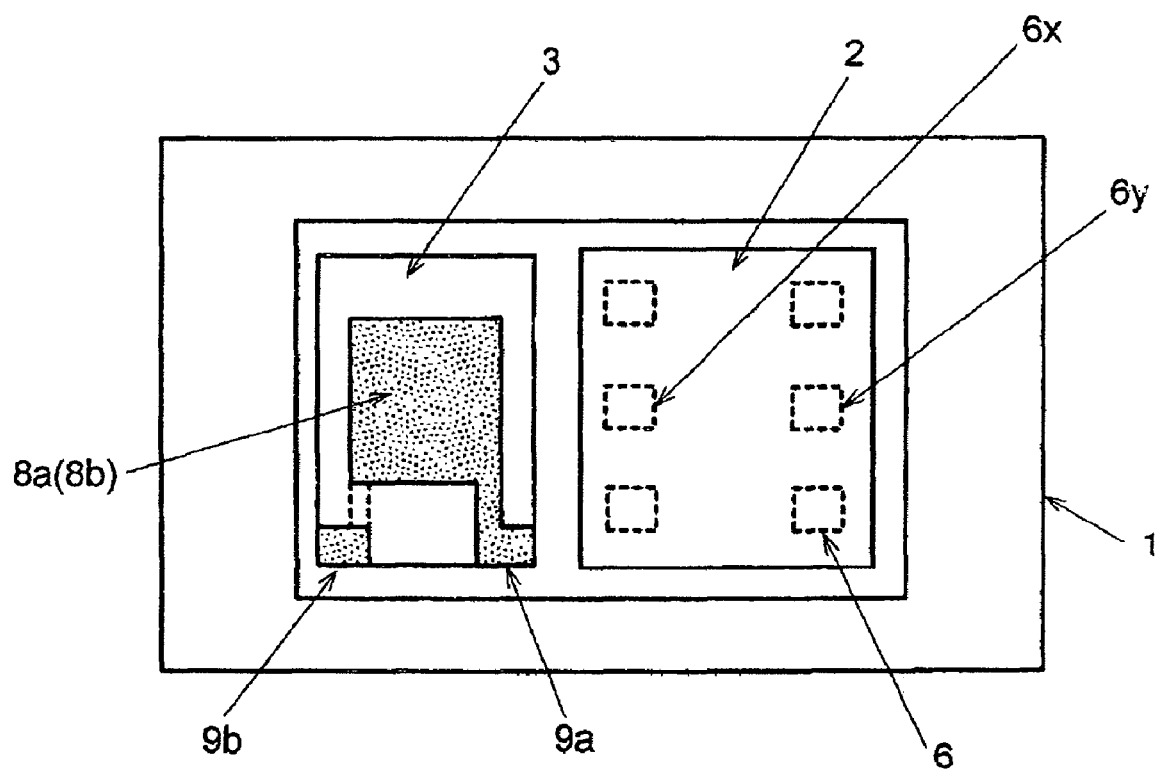
FIG. 2B is a plan view of the crystal oscillator shown in FIG. 2A with a cover removed therefrom.
Figure 3A:
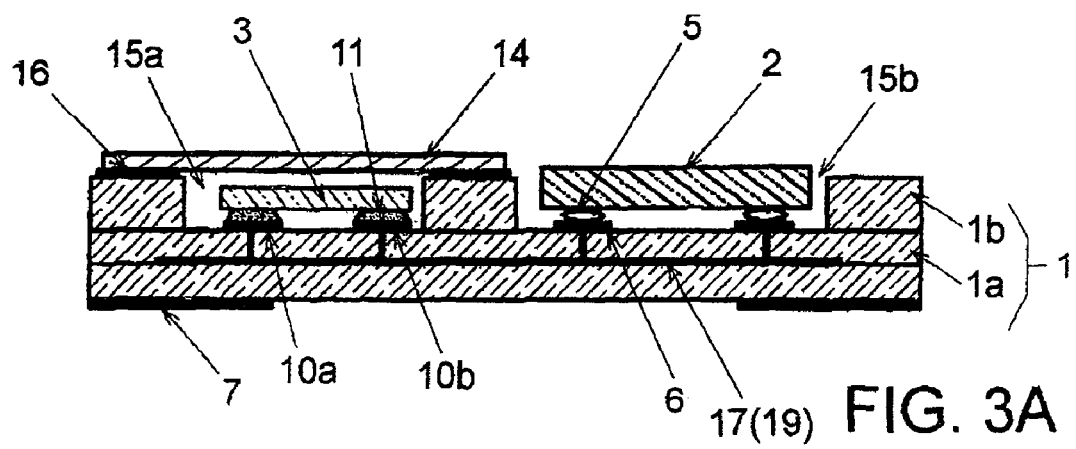
FIG. 3A is a sectional view showing a configuration of a surface-mount type temperature compensated crystal oscillator according to a first embodiment of the present invention.
Figure 3B:
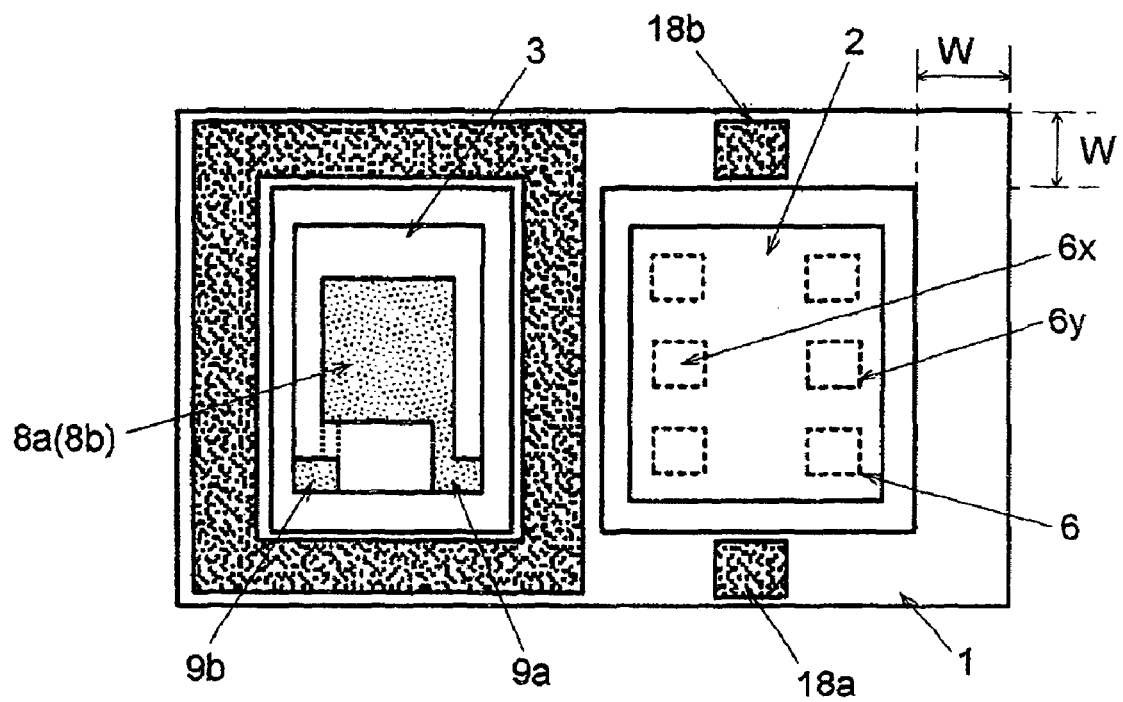
FIG. 3B is a plan view of the crystal oscillator shown in FIG. 3A with a cover removed therefrom.
Figure 3C:
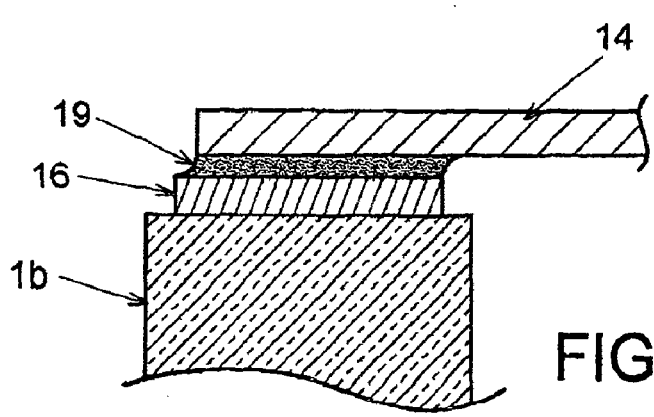
FIG. 3C is a partly enlarged sectional view showing a portion of a top surface of a frame wall to which a metal cover is joined.

In FIGS. 3A, 3B, and 3C showing a surface-mount type temperature compensated crystal oscillator according to a first embodiment of the present invention, the same components as those in FIGS. 1A, 1B, 2A, and 2B are denoted by the same reference numerals. Duplicate descriptions will not be repeated.

In the crystal oscillator according to the present embodiment, IC chip 2 and quartz crystal blank 3 are mounted in container body 1 made up of laminated ceramics, as is the case with the crystal oscillator shown in FIGS. 2A and 2B. Container body 1 is configured such that frame wall 1b is laminated on bottom wall 1a which has a generally rectangular, flat plate shape. Bottom wall 1a is composed of two ceramic layers. Two generally rectangular openings are formed in juxtaposition in frame wall 1b. The openings form first recess 15a and second recess 15b in one principal surface of container body 1. The planar outside dimension of container body 1 is, for example, 3.2 mm×2.5 mm, which is a de facto standard value for surface-mount type crystal oscillators. In frame wall 1b, a distance from an inner side surface of the opening to an outer side surface of frame wall 1b, that is, frame width W, is, for example, 0.425 mm. Crystal blank 3 shown in FIG. 2B may be directly used for the present embodiment.

Metal film 16 is provided on a top surface of frame wall 1b so as to enclose first recess 15a. A pair of holding terminals 10a, 10b is formed on an inner bottom surface of first recess 15a. Opposite sides of one end of crystal blank 3 on which extraction electrodes 9a, 9b are extracted from excitation electrodes 8a, 8b are secured to holding terminals 10a, 10b, respectively, with conductive adhesive 11. Thus, crystal blank 3 is held in first recess 15a. As shown in FIG. 3C, crystal blank 3 is hermetically encapsulated in first recess 15a by bonding metal cover 14 to metal film 16 by means of brazing using eutectic alloy 19.

If metal cover 14 is bonded to the top surface of frame wall 1b by seam welding, it is difficult to allow an electrode roller for the seam welding to abut against frame wall 1b in an area corresponding to a boundary between first recess 15a and second recess 15b. Thus, in the present embodiment, the brazing with the eutectic alloy is more preferable for bonding of metal cover 14 than the seam welding. Alternatively, the metal cover may be arranged on the top surface of frame wall 1b by electron beam welding.

A plurality of circuit terminals 6 are provided on an inner bottom surface of second recess 15b in association with IC terminals 4 of IC chip 2. Here, IC chip 2 shown in FIG. 1B may be used directly for the present embodiment. In the illustrated example, six circuit terminals 6 are provided, and two of these circuit terminals 6 are crystal circuit terminals 6x, 6y. Crystal circuit terminals 6x, 6y are electrically connected to crystal holding terminals 10a, 10b in first recess 15a via via-holes penetrating the ceramic layer in container body 1 and wiring path 17 formed in a lamination plane between the ceramic layers. All circuit terminals 6 other than crystal circuit terminals 6x, 6y correspond to a power supply terminal, an output terminal, a ground terminal, an AFC terminal and the like in IC chip 2. These circuit terminals 6 are electrically connected, via via-holes and a wiring path (not shown), to mounting terminals 7 provided on an outer bottom surface of container body 1.

A pair of inspection terminals 18a, 18b is provided in an area of the top surface of frame wall 1b which encloses second recess 15b. Inspection terminals 18a, 18b are provided away from the metal cover. In the illustrated example, inspection terminals 18a, 18b are provided at a position corresponding to a central portion of an upper side, in the figure, of second recess 15b and a position corresponding to a central portion of a lower side, in the figure, of second recess 15b, respectively, so as to minimize a distance from inspection terminals 18a, 18b to crystal circuit terminals 6x, 6y. Via via-holes and wiring path 17 formed in container body 1, inspection terminals 18a, 18b are electrically connected directly to crystal circuit terminals 6x, 6y and thus to holding terminals 10a, 10b. As described above, when frame wall 1b is 0.425 mm in frame width W, the size of inspection terminals 18a, 18b is within the range of frame width W, for example, 0.4 mm×0.4 mm. Since inspection terminals 18a, 18b are electrically connected to holding terminals 10a, 10b, inspection terminals 18a, 18b are electrically connected directly, without passing through IC chip 2, to excitation electrodes 8a, 8b of crystal blank 3 held by holding terminals 10a, 10b. Inspection terminals 18a, 18b can be used to inspect crystal blank 3, serving as a crystal unit, for vibration characteristics.

By securing IC terminals 4 to circuit terminals 6 by ultrasonic thermocompression bonding using bumps 5, IC chip 2 is secured in second recess 15b and thus electrically connected to circuit terminals 6.

Figure 4:
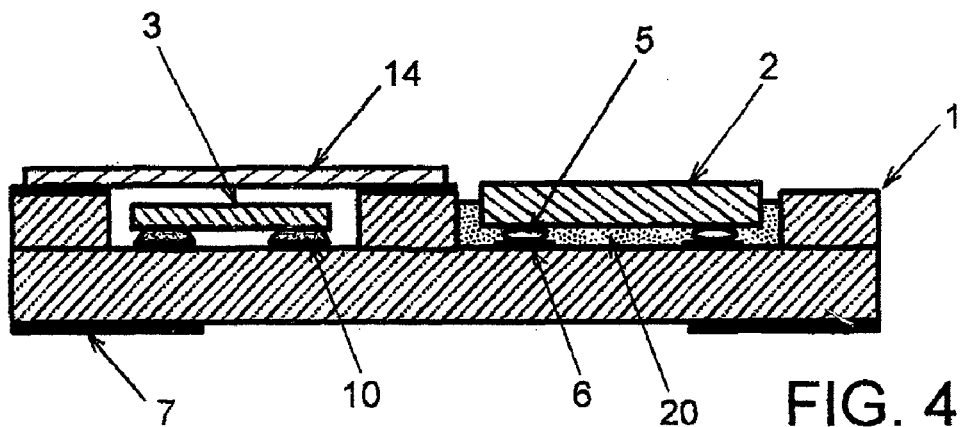
FIG. 4 is a sectional view of a crystal oscillator according to the first embodiment which includes protective resin that protects a circuit forming surface of the IC chip.

In the present embodiment, a surface of IC chip 2 which is located opposite a circuit forming surface projects slightly from the top surface of frame wall 1b but lies below the level of a top surface of metal cover 14. Thus, the present embodiment avoids closing second recess 15b with the metal cover, thus preventing an increase in the height of the crystal oscillator. In general, if the crystal oscillator is incorporated into an electronic card, a top surface of the crystal oscillator is coated with resin. This eliminates the need to seal IC chip 2 with the metal cover. However, depending on the type of the resin used to coat the electronic card, the circuit forming surface of IC chip 2 may need to be protected from ambient air. In this case, as shown in FIG. 4, resin 20 may be injected into second recess 15b to protect the circuit forming surface.

In the crystal oscillator according to the present embodiment, in bottom wall 1a made up of two ceramic layers, shield electrode layer 19 is formed on the entire lamination plane between the two ceramic layers except for positions where wiring path 17 and through-holes are formed. In the figure, shield electrode layer 19 overlaps wiring path 17 for description.

In the above-described crystal oscillator, for example, each of the two layers making up bottom wall 1a of container body 1 can be 65 µm in thickness, and entire bottom wall 1a can be 130 µm in thickness. Frame wall 1b can be 130 µm in thickness, and metal cover 14 can be 60 µm in thickness. Then, provided that the total thickness of mounting terminal 7, metal film 16, and eutectic alloy 19 is 45 µm, the height dimension of the entire crystal oscillator can be 365 µm. Provided that crystal blank 3 is an AT-cut quartz crystal blank and has an oscillation frequency of 26 MHz, crystal blank 3 is 64 µm in thickness. The planar outside dimension of crystal blank 3 can be, for example, 1.35 mm×0.85 mm. IC chip 2 is 120 µm in thickness and for example, 1.0 mm×1.1 mm in planar outside dimension.

In the crystal oscillator according to the present embodiment, IC chip 2 is accommodated in second recess 15b, which is different from first recess 15a, in which crystal blank 3 is accommodated. Thus, the height of the crystal oscillator depends on the height of the crystal unit portion constructed by hermetically encapsulating crystal blank 3 in first recess 15a. Provided that the thicknesses of the layers making up the crystal oscillators are as described above, the height dimension of the surface-mount type temperature compensated crystal oscillator according to the present embodiment can be 0.4 mm or less. This meets the condition that the surface-mount type crystal oscillator has a thickness of 0.5 mm or less, which is required for applications in which the crystal oscillator is incorporated into, for example, the SIM card.

Furthermore, in the present embodiment, inspection terminals 18a, 18b are provided on an area of the top surface of frame wall 1b which surrounds second recess 15b. Thus, the vibration characteristics of crystal blank 3, serving as a crystal unit, can be easily measured. The inspection terminals may be provided on an outer bottom surface of container body 1. However, in this case, when the crystal oscillator is mounted on the wiring board, a stray capacity may be generated between a wiring pattern on the wiring board and the inspection terminals to change the oscillation frequency of the crystal oscillator.

In the present embodiment, IC chip 2 is located in second recess 15b. Thus, frame wall 1b is also present around the periphery of IC chip 2. The presence of frame wall 1b, provided so as to enclose IC chip 2, allows the mechanical strength of the crystal oscillator to be maintained in spite of the reduced thickness of the bottom wall, compared to the absence of such a frame wall.

Figure 5A:
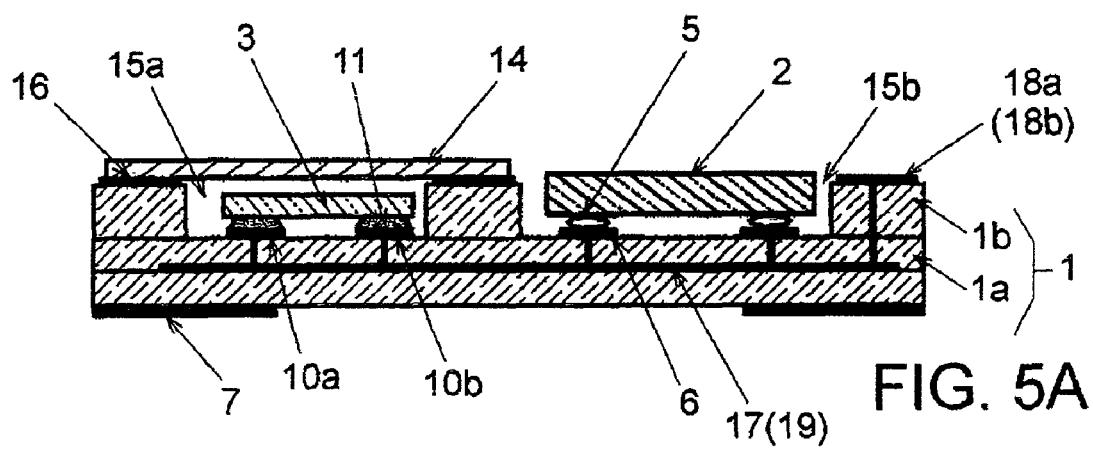
FIG. 5A is a sectional view showing a configuration of a surface-mount type temperature compensated crystal oscillator according to a second embodiment of the present invention.
Figure 5B:
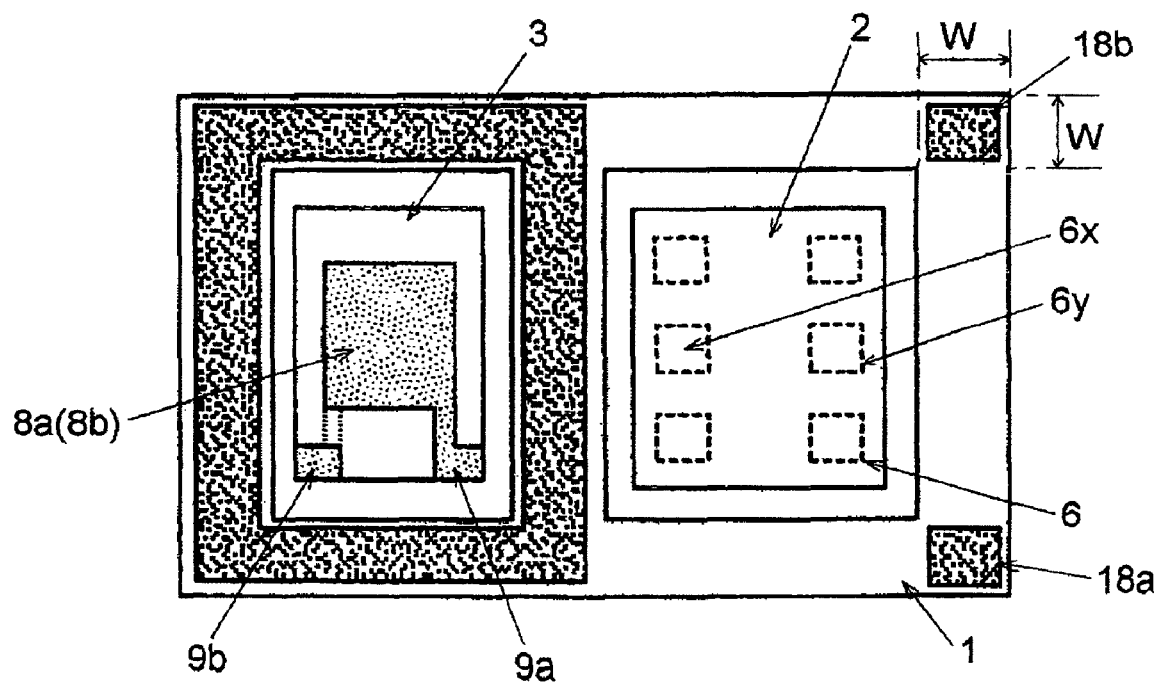
FIG. 5B is a plan view of the crystal oscillator shown in FIG. 5A with a cover removed therefrom.

A surface-mount type temperature compensated crystal oscillator according to a second embodiment of the present invention will be next described with reference to FIGS. 5A and 5B. The crystal oscillator according to the second embodiment is similar to that according to the first embodiment, described above, except for the positions of the inspection terminals on the top surface of frame wall 1b. In the crystal oscillator according to the second embodiment, inspection terminals 18a, 18b are formed in two of the four corners of the top surface of frame wall 1b which are located closer to second recess 15b.

Figure 6:
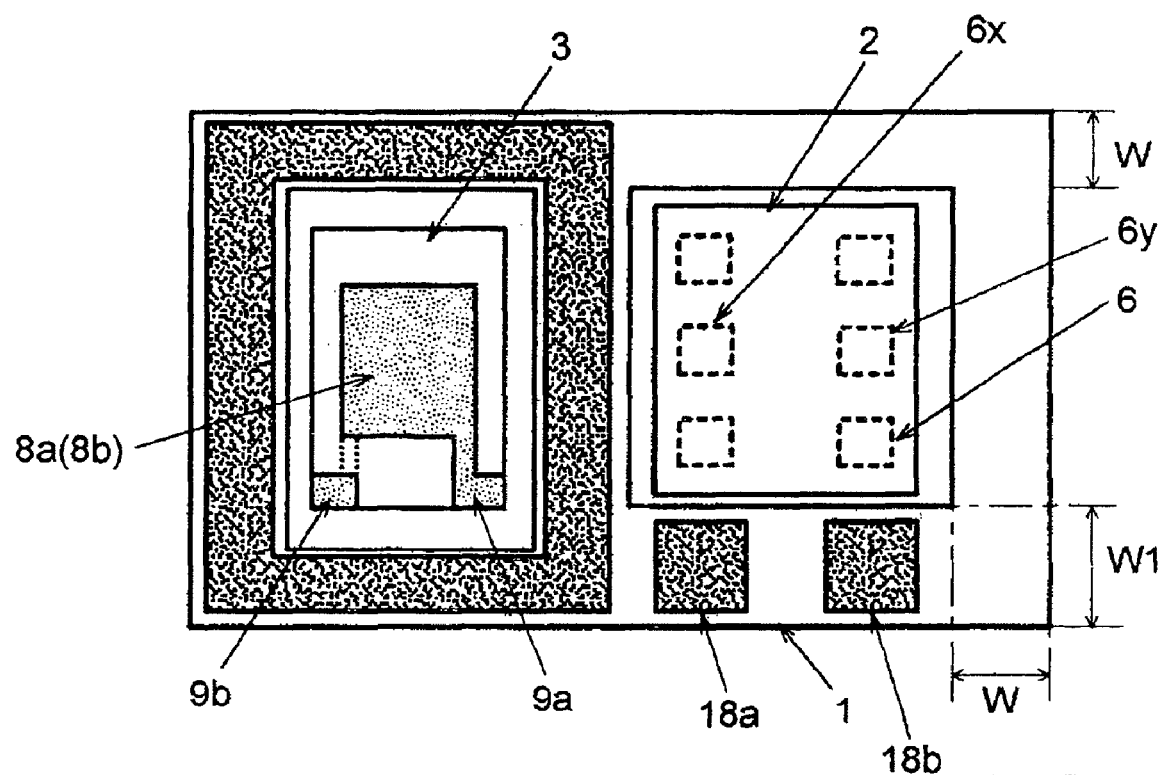
FIG. 6 is a plan view of a surface-mount type temperature compensated crystal oscillator according to a third embodiment of the present invention with a cover removed therefrom.

A surface-mount type temperature compensated crystal oscillator according to a third embodiment of the present invention will be next described with reference to FIG. 6. The crystal oscillator according to the third embodiment is similar to that according to the first embodiment, described above, except for the positions of the inspection terminals on the top surface of frame wall 1b.

In the third embodiment, the frame width of frame wall 1b is larger on one side of second recess 15b with IC chip 2 accommodated therein than on the other sides thereof. For example, frame width W1 on a lower side, in FIG. 6, of second recess 15b is set to be larger than frame width W in other regions. In particular, frame width W1 on the lower side, in FIG. 6, of second recess 15b is larger than the frame width at a position where frame wall 1b surrounds first recess 15a. A pair of inspection terminals 18a, 18b are formed in an area of the top surface of frame wall 1b which has frame width W1. Thus, the increased frame width allows the size of inspection terminals 18a, 18b to be further increased. This enables a probe to be more reliably contacted with inspection terminals 18a, 18b.

Figure 7A:
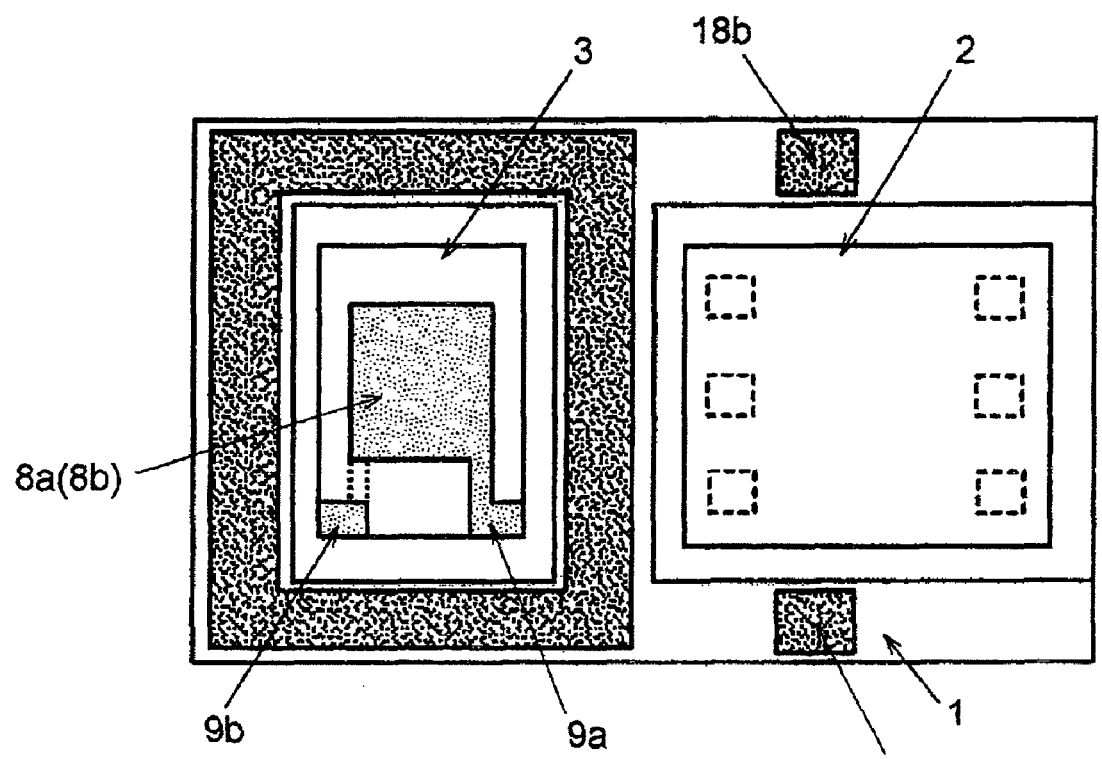
FIGS. 7A and 7B are plan views of surface-mount type temperature compensated crystal oscillators according to a fourth embodiment of the present invention with a cover removed therefrom.
Figure 7B:
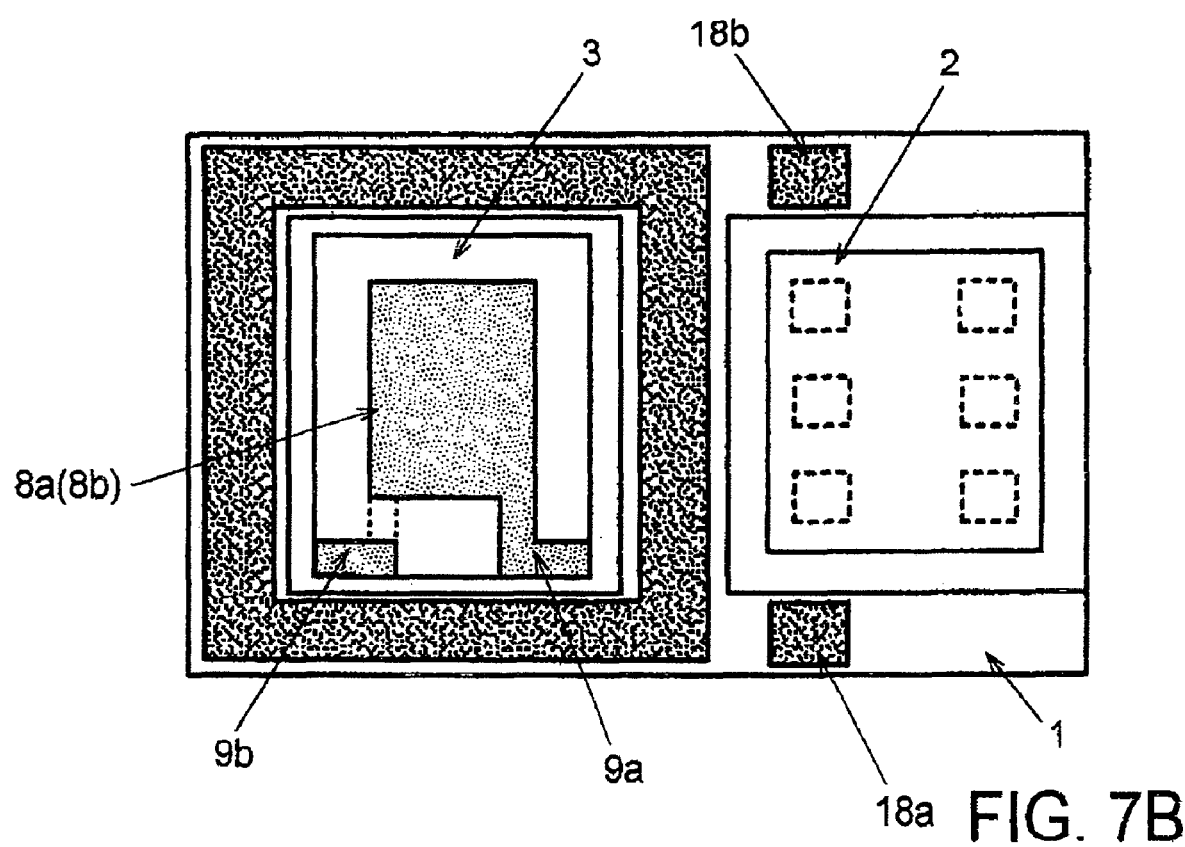

A surface-mount type temperature compensated crystal oscillator according to a fourth embodiment of the present invention will be next described FIGS. 7A and 7B show the respective crystal oscillators according to the fourth embodiment. The crystal oscillators can accommodate an IC chip or a crystal blank which is larger than that according to the above-described embodiments. In the crystal oscillators, frame wall 1b is removed from second recess 15b, in which IC chip 2 is accommodated, at the position of one outer peripheral side thereof. At the position where frame wall 1b is removed, a top surface of bottom wall 1a is exposed to make up a flat surface. This makes second recess 15b open toward an outer peripheral side of container body 1.

In the crystal oscillator shown in FIG. 7A, frame wall 1b is removed from one of the four sides of second recess 15b which is located opposite first recess 15a, so as to expose the top surface of bottom wall 1a in the corresponding area. In this configuration, the area of the inner bottom surface of second recess 15b is substantially increased to enable larger IC chip 2 to be accommodated in second recess 15b. For example, IC chip 2 with the size thereof increased owing to circuits integrated into IC chip 2 in order to add value can be accommodated in second recess 15b. This enables a crystal oscillator with more types of functions to be configured.

Furthermore, if a part of frame wall 1b is removed as shown in FIG. 7A and the size of IC chip 2 remains unchanged, a relevant portion of the frame wall which corresponds to a boundary between first recess 15a and second recess 15b can be moved toward second recess 15b. The area of the inner bottom surface of first recess 15a can thus be increased. FIG. 7B shows a crystal oscillator with the area of the inner bottom surface of first recess 15a thus increased. This configuration enables the use of larger crystal blank 23, allowing the crystal oscillator to be designed such that crystal blank 3 exhibits improved vibration characteristics.

In both crystal oscillators shown in FIGS. 7A and 7B, frame wall 1b is removed from only one outer peripheral side of second recess 15b and remains on the other sides thereof. Thus, the mechanical strength of the crystal oscillator is maintained.

Figure 8:
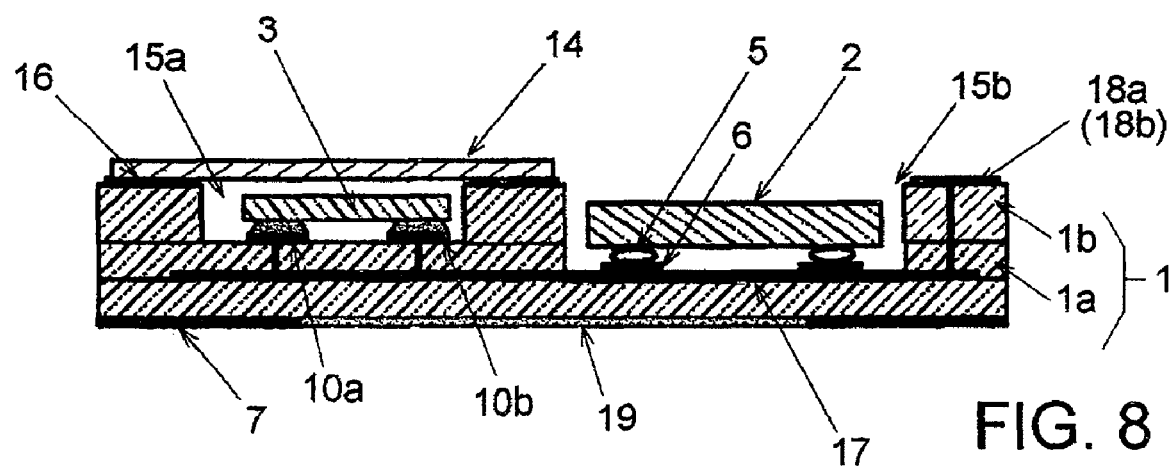
FIG. 8 is a sectional view showing a configuration of a surface-mount type temperature compensated crystal oscillator according to another embodiment of the present invention.

In the above-described embodiments, in any areas of first recess 15a and second recess 15b, bottom wall 1a is, but not limited to, made up of two ceramic layers with shield electrode layer 19 provided between the ceramic layers. For example, as shown in FIG. 8, bottom wall 1a may have a one-layer structure in the area in which second recess 15b is formed. In this case, in the area in which second recess 15b is formed, the thickness of bottom wall 1a is small and, for example, 65 µm. This may reduce the mechanical strength and this decrease in mechanical strength can be compensated for by increasing the frame width of frame wall 1b, which encloses second recess 15b. By reducing the thickness of bottom wall 1a at the position of second recess 15b, the position of the surface of IC chip 2 which is different from the circuit forming surface can be located below the level of the top surface of frame wall 1b. In this case, shield electrode layer 19 is formed on, for example, the outer bottom surface of container body 1.

In the above description, IC chip 2 is connected to the circuit terminals by ultrasonic thermocompression bonding using the bumps. However, instead of the ultrasonic thermocompression bonding, for example, wire bonding may be used to mount IC chip 2 in second recess 15b. In this case, effects similar to those of the above-described embodiments can be exerted provided that the loop height of a bonding wire is equivalent to or smaller than the height of the bumps (for example, 40 µm).

In the above description, the surface-mount type crystal oscillator is of the temperature compensating type. However, of course, the present invention is applicable to a surface-mount type simple packaged crystal oscillator, i.e., a surface-mount type crystal oscillator without a temperature compensating mechanism.

What is claimed is:

1. A surface-mount type crystal oscillator comprising:
a container body with a first recess and a second recess;
a crystal blank including excitation electrodes on respective principal surfaces thereof and hermetically encapsulated in the first recess; and
an IC chip which is accommodated in the second recess and into which at least an oscillation circuit using the crystal blank is integrated,
wherein the container body includes a bottom wall and a frame wall provided on the bottom wall,
openings which make up the first and second recesses, respectively, are formed in juxtaposition in the frame wall,
an inspection terminal is provided in an area of a top surface of the frame wall which surrounds the second recess, the inspection terminal being electrically connected to the excitation electrode of the crystal blank, and
the frame wall is removed from any one outer peripheral side of the second recess to form a flat surface made of a portion of a top surface of said bottom wall so that the second recess is open in one direction toward an outer periphery of the container body.

2. The crystal oscillator according to claim 1, further comprising a metal cover bonded to the top surface of the frame wall without covering the inspection terminal to close the first recess.

3. The crystal oscillator according to claim 2, wherein the metal cover is bonded to the top surface of the frame wall using a eutectic alloy.

4. The crystal oscillator according to claim 1, wherein frame width of the frame wall is larger at a position of the frame wall which corresponds to at least one side of the second recess than in an area of the frame wall which surrounds the first recess, and
the inspection terminal is provided on the top surface of the frame wall at the position corresponding to at least the one side.

5. The crystal oscillator according to claim 1, wherein the container body comprises laminated ceramics.

* * * * *